United States Patent
Harris, II et al.

[11] Patent Number: 5,901,103
[45] Date of Patent: May 4, 1999

[54] INTEGRATED CIRCUIT HAVING STANDBY CONTROL FOR MEMORY AND METHOD THEREOF

[75] Inventors: Joseph M. Harris, II, Cedar Park; John P. Dunn, Austin; Theo C. Freund, Austin; James C. Nash, Austin, all of Tex.

[73] Assignee: Motorola, Inc., Schaumburg, Ill.

[21] Appl. No.: 08/835,363

[22] Filed: Apr. 7, 1997

[51] Int. Cl.⁶ ........................................ G11C 7/00
[52] U.S. Cl. .................. 365/226; 365/229; 365/230.03; 365/201
[58] Field of Search ..................... 365/226, 229, 365/230.03, 201, 154

[56] References Cited

U.S. PATENT DOCUMENTS

| | | | |
|---|---|---|---|
| 4,388,706 | 6/1983 | Butler | 365/226 |
| 4,984,211 | 1/1991 | Tran | 365/229 |
| 5,079,744 | 1/1992 | Tobita et al. | 365/201 |
| 5,127,096 | 6/1992 | Kaneko et al. | 395/425 |
| 5,283,905 | 2/1994 | Saadeh et al. | 395/750 |
| 5,343,436 | 8/1994 | Suzuki | 365/229 X |
| 5,537,360 | 7/1996 | Jones et al. | 365/226 |
| 5,594,694 | 1/1997 | Roohparvar et al. | 365/201 |
| 5,615,159 | 3/1997 | Roohparvar | 365/201 |
| 5,616,162 | 4/1997 | Houston | 365/226 |

OTHER PUBLICATIONS

Joseph M. Harris II et al., Motorola Inc., "Method and Apparatus for Testing On–Chip Memory on a Microcontroller", Application No. 08/669,863, Filed Jun. 10, 1996.

*Primary Examiner*—Huan Hoang
*Attorney, Agent, or Firm*—Kent J. Cooper

[57] ABSTRACT

An integrated circuit (10) contains a central processing unit (CPU) (12) and a plurality of memory blocks (26–34) configured into one or more banks of memory. A plurality of power control switches (38–42) are used to dynamically select which of a plurality of external voltage supply signals are provided to power each of the memory blocks (26–34). The power control switches (38–42) may be configured from software via writing the data to a register (24) or can be enabled by test control circuitry (22) or can be automatically enabled in response to VDD power voltage failure. In addition, an intelligent controller can dynamically control the switches in response to execution flow of data accesses and instruction fetches from the memory banks so that only currently accessed memory banks or recently accessed memory banks are activated at a high power level while all other memory banks are in a low power stand-by mode.

50 Claims, 8 Drawing Sheets

3,901,103

INTEGRATED CIRCUIT HAVING STANDBY CONTROL FOR MEMORY AND METHOD THEREOF

RELATED APPLICATIONS

This is related to U.S. patent application Ser. No. 08/669,863, filed on Jun. 10, 1996, and assigned to the current assignee hereof.

FIELD OF THE INVENTION

The present invention relates generally to data processing systems, and more particularly, to dynamically selecting a set of memory banks among a plurality of memory banks as standby memory within an integrated circuit.

BACKGROUND OF THE INVENTION

In modern integrated circuits, such as microcontrollers, microprocessors, and randomly accessed memories (RAM), the integrated circuits (ICs) are typically provided with more than one power signal (e.g. a standby power signal and a normal operation power signal, etc.). A first power supply signal is used for normal functional mode IC operation (e.g. VDD), while a second power supply signal is used as a backup power supply for standby mode IC operation (e.g. VSTBY). In modern designs, the entire memory array within the integrated circuit (IC) is either backed up by the backup power supply or it is not backed up by the backup power supply. Therefore, if the first power supply signal fails and the memory array is backed up by the second power supply signal, then data that was stored in the memory array prior to the power failure is retained in the memory array. However, if the first power supply signal fails and the memory array is not backed up by the second power supply signal, then data that was stored in the memory array prior to the power failure is lost. When using this inflexible system, a user of the integrated circuit (IC) is always in the situation where all the data stored in memory array is either lost or retained when the first power signal fails. There is no flexibility in this system such that certain portions of the memory are backed up by the second power supply signal while another portion of the memory is not backed up by the second power supply signal. Thus, memory backup cannot be performed on a piece-meal programmable basis. Therefore, this lack of flexibility impacts the power consumed by the part and the ability for wide applicability and flexibility of the integrated circuit (IC).

Therefore, the need exists for a method that allows a standby power signal (or low power signal) to be selectively coupled to a bank or block of memory in a memory array comprising a plurality of banks or blocks of memory. This added functionality is desirable to allow for enhanced IC power management, selective data retention management, and more flexible power loss response.

Figure 1:
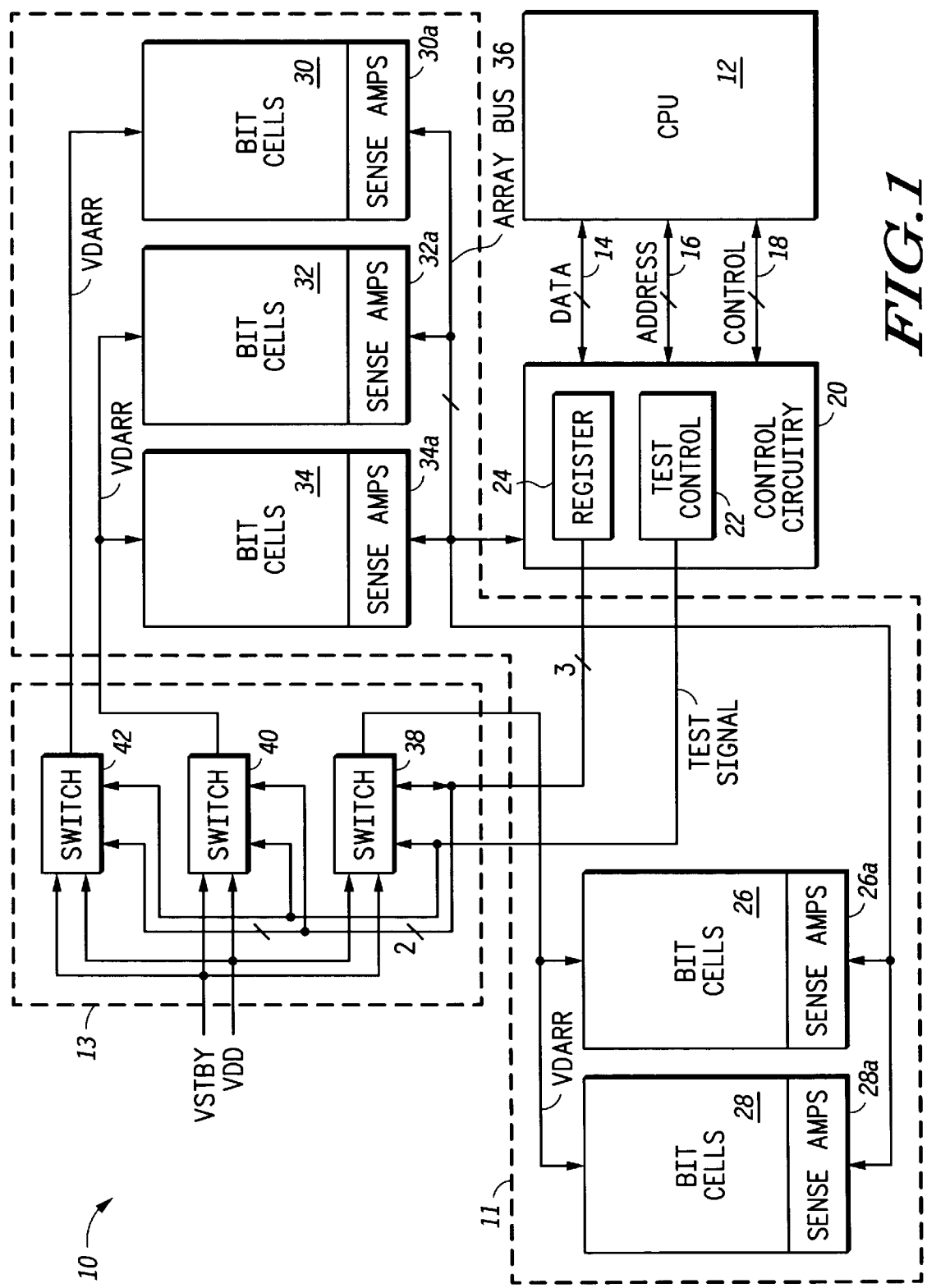
FIG. 1 illustrates, in a block diagram, a data processing system containing power-switchable banks and blocks of memory in accordance with the present invention.

It will be appreciated that for simplicity and clarity of illustration, elements illustrated in the figures have not necessarily been drawn to scale. For example, the dimensions of some of the elements are exaggerated relative to other elements for clarity. Further, where considered appropriate, reference numerals have been repeated among the figures to indicate corresponding or analogous elements.

DESCRIPTION OF A PREFERRED EMBODIMENT

Generally, the present invention involves providing switches within an integrated circuit (IC) wherein the switches provide one of a plurality of independent voltage supply signals to switch outputs. By changing the voltage supplied at the switch outputs, different banks and/or blocks of memory can be selected to be backed up when a power failure occurs, while other banks and/or blocks of memory are not. In addition, by changing the voltage supplied at the switch outputs, different banks and/or blocks of memory can receive different power supply voltages during concurrent time periods. For example, each bank or block of memory can be independently configured to be coupled to VDD, a stand-by power supply (VSTBY), or a low voltage supply. These two or more power supply signals can be selectively coupled to one or more memory blocks or banks within the integrated circuit so that individual memory blocks or banks can be powered by different voltage supply sources as the system requires.

Taught herein are four methods in which to control which voltage source signal is routed to which bank of memory wherein one or more of these methods can be employed by each switch in the IC. In a first method, a test control circuit outputs a control signal which enables one or more switches to provide a standby voltage to one or more banks of memory instead of a normal functional VDD power source. In a second method, a user accessible register 24 can be written by a user or software to dynamically select which banks of memory will receive stand-by voltage VSTBY (i.e., stand-by memory is created) when VDD fails while selecting which banks of memory will continue to be coupled to the VDD power supply (i.e., non-stand-by memory is created) when VDD fails. In a third method, the switches can be designed so that if one power supply fails, the switches will automatically select a second stand-by or back-up power supply source which can maintain the contents of selected banks of memory in spite of main power failure. In a fourth form, intelligent control circuitry within the integrated circuit can monitor execution flow, prefetching of software instructions, and/or memory location data accesses in order to selectively enable to a high-power mode only those banks of memory being accessed (accessed recently or most frequently accessed) while selectively disabling banks of memory into a low power data-retained mode of operation when these banks are not being accessed or are unlikely to be accessed in the near future. By using one or more of these methods via a set of switches, more flexibility is being given to a user to dynamically determine which banks or blocks of memory are to be designated as standby memory and which blocks of memory are to be designated as non-standby memory. More specifically, one or more of these methods can be used to determine what portion of the memory is backed up and retains its data, and what portions of the memory is not backed up and loses its data upon a power failure. This offers the further advantage of allowing a user some control over power consumption within a system and allows more flexibility in structuring the memory power distribution within a data processing system.

The present invention can be further understood with references to FIGS. 1–8.

FIG. 1 illustrates an integrated circuit 10 in accordance with one embodiment of the invention. Integrated circuit 10 comprises a central processing unit (CPU) 12, control circuitry 20, a memory array 11; and switch circuitry 13. In FIG. 1, CPU 12 can be any CPU which executes or processes instructions or integrated circuit data of any size and at any frequency. It should be appreciated, however, that the present invention is not limited to microcontrollers or microprocessors, but may also be used in integrated circuits which are devoid of a CPU, such as an SRAM. CPU 12 communicates with control circuitry 20 via a data bus 14, and address bus 16, and control signals 18. Control circuitry 20 communicates bi-directionally with CPU 12 to provide read and write access to memory array 11 in FIG. 1. In addition, control circuitry 20 controls switch circuitry 13 whereby control circuitry 20 will determine which of a plurality of voltage supply terminals are coupled to selected blocks or banks of memory.

Memory array 11 contains a plurality of memory blocks 26–34, wherein each memory block contains a plurality of volatile memory cells, such as a plurality of six transistor (6T) or four transistor (4T) SRAM cells. Memory blocks 26–34 can be configured so that each block can be selected to receive a supply voltage independent of the voltage selected for all other memory blocks, or memory blocks 26–34 can be configured into some system of memory banks. In the case of memory banks, each bank will contain one or preferably more blocks, wherein all blocks in the bank are supply voltage selectable as a set. Specifically, in FIG. 1, memory blocks 34 and 32 are configured as a single bank, memory block 30 is a stand alone single block bank of memory, and memory blocks 26 and 28 are configured as a third bank of memory. In FIG. 1, power supply signals are routed on a bank-by-bank basis where all blocks in one bank are treated the same in terms of power supply voltages. In general, a bank of memory is any portion of the memory array 11 which contains one or more collective blocks of memory which are to be treated as a collective set of memory cells for power supply purposes. A plurality of sense amps 26a–34a are individually coupled to each of memory blocks 26–34. These sense amps 26a–34a enable read operations from memory blocks 26–34 so that CPU 12 can access information stored within memory blocks 26–34. In addition, data is also capable of being written to memory blocks 26–34 via an array bus 36 illustrated in FIG. 1. In general, array bus 36 is a bidirectional bus that communicates bidirectionally between CPU 12 and memory array 11 via control circuitry 20.

Figure 2:
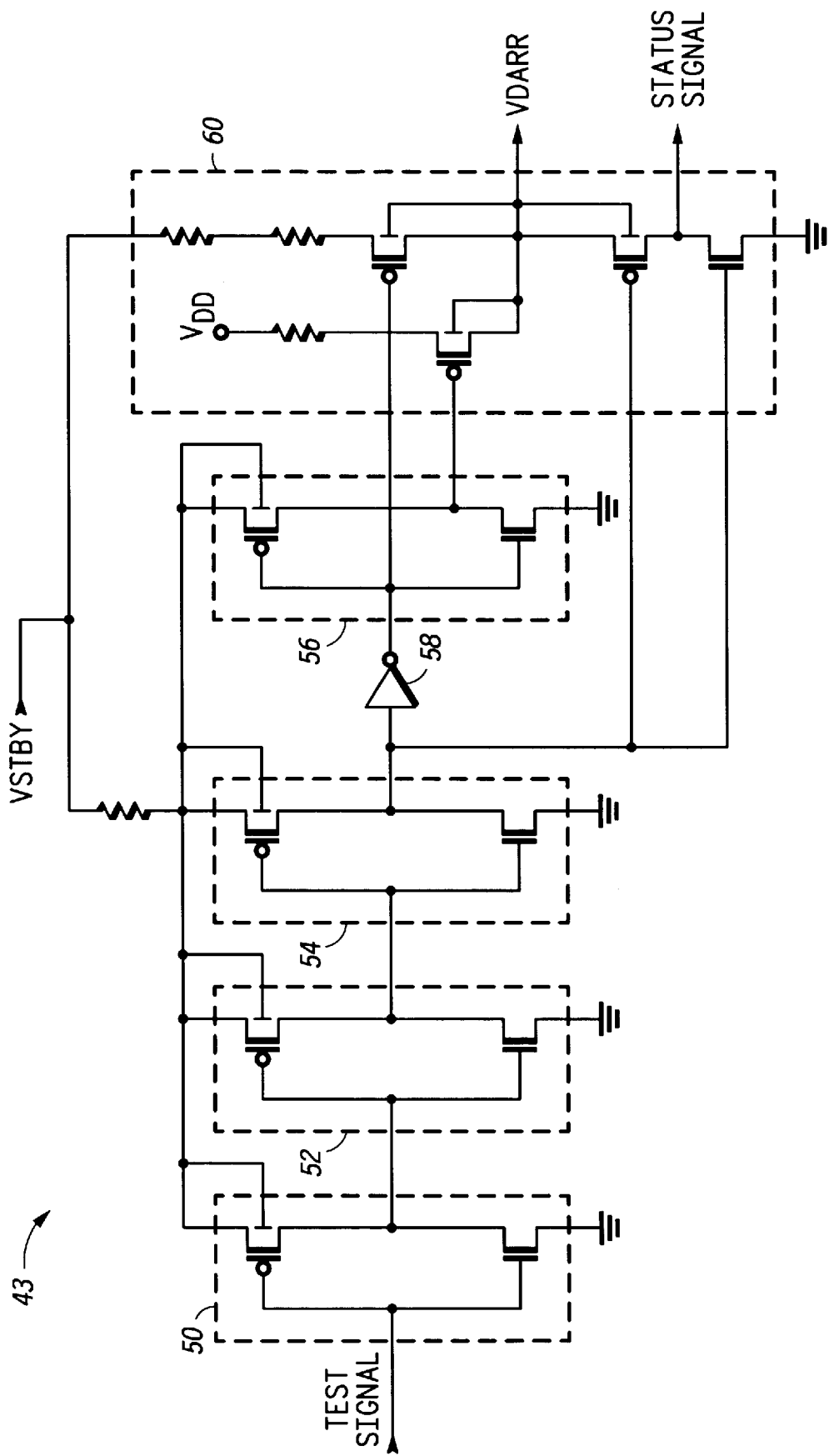
FIG. 2 illustrates, in a circuit schematic, a switching circuit which can be used to switch voltage supply in FIG. 1 in accordance with the present invention.
Figure 3:
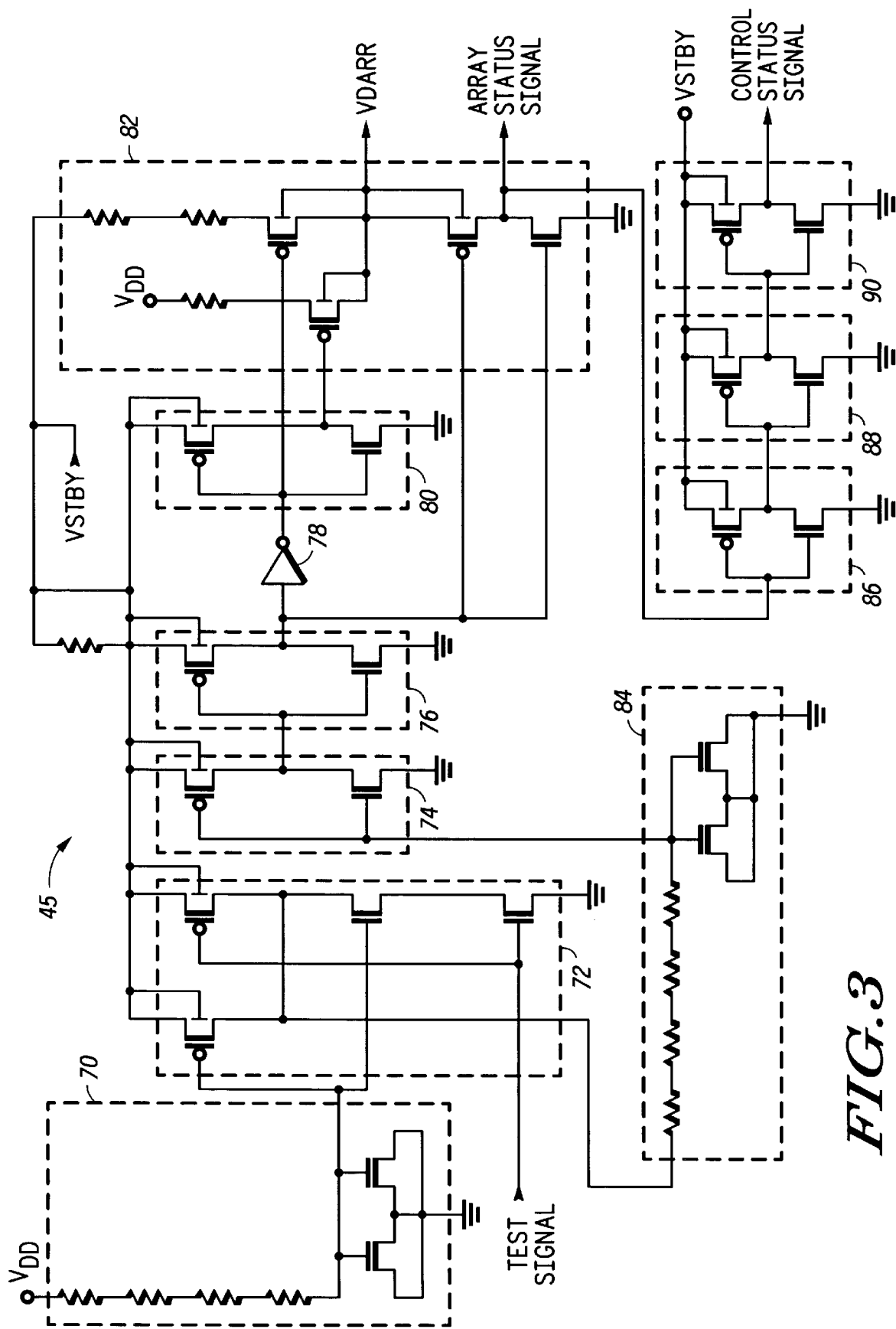
FIG. 3 illustrates, in a circuit schematic, another switching circuit which can be used to switch voltage supply in FIG. 1 in accordance with the present invention.
Figure 4:
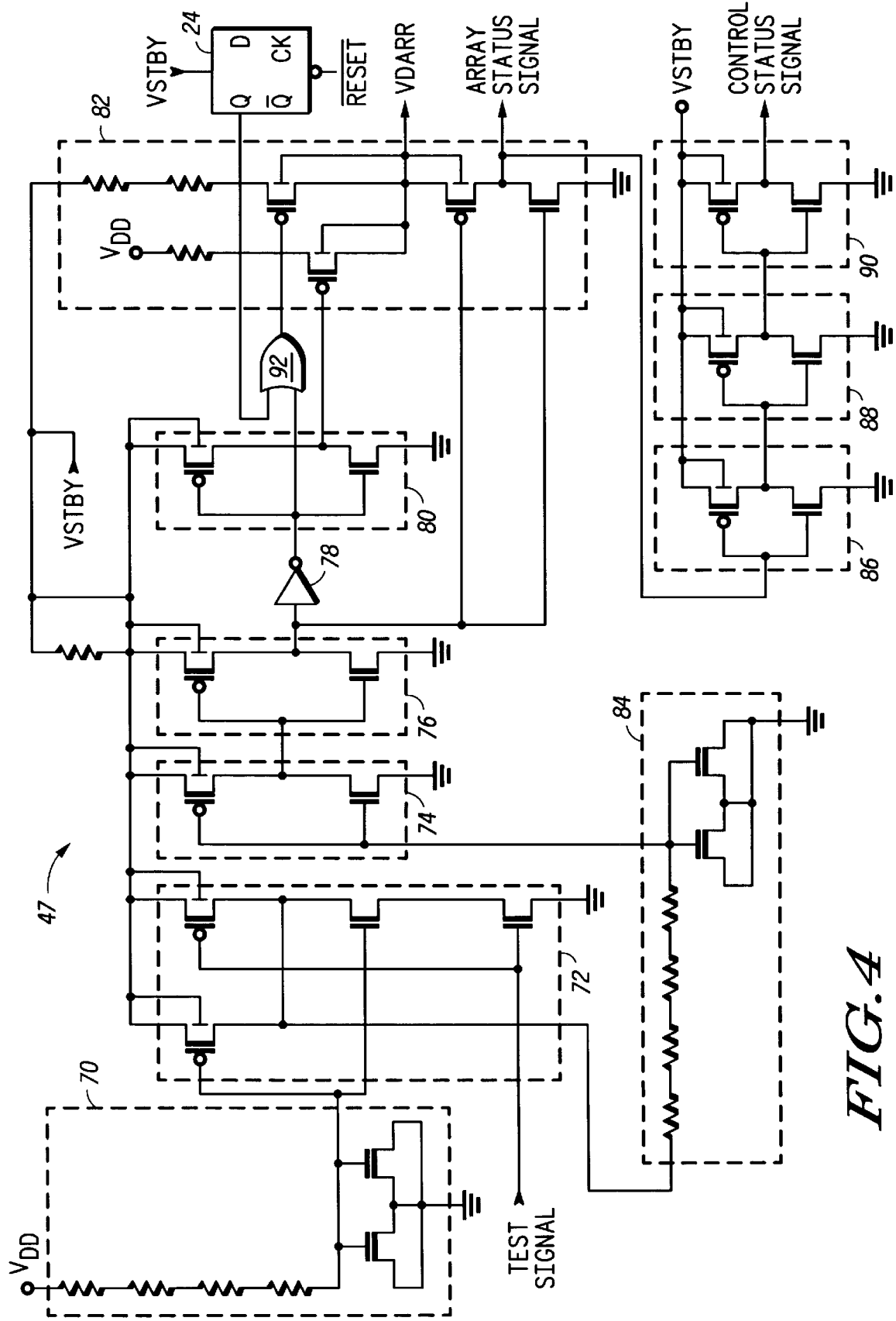
FIG. 4 illustrates, in a circuit schematic, yet another switching circuit which can be used in FIG. 1 to switch between voltage terminals in an integrated circuit in accordance with the present invention.

Switching circuitry 13 contains a plurality of power control switches. Since memory array 11 of FIG. 1 is illustrated, by way of example, as being configured in three distinct memory banks, three distinct power control switches 38–42 are illustrated in FIG. 1. Each power control switch 38–42 is coupled to a plurality of power lines, such as a VDD line, a low power line, or a standby voltage line. Specifically, in FIG. 1, each power control switch 38–42 is coupled to a VDD power supply voltage line and a standby (VSTBY) power supply voltage line, wherein the voltage on the VDD power supply voltage line is greater than or equal to that on the standby power supply voltage line. Power control switches 38–42 select one of either the VDD signal or the VSTBY signal for each one of the three banks of memory defined in FIG. 1. Selection of either VSTBY or VDD is based upon a specific design implemented in power control switches 38–42. More specifically, the selection of VSTBY or VDD is based upon which banks or blocks of memory have been selected to be backed up if VDD fails. In FIGS. 2–4 (subsequently discussed in more detail) there are three possible switching circuits which can be used to implement any one of power control switches 38–42. If switching circuit 43 of FIG. 2 is selected for use in any one of power control switches 38–42, the power control switch will not require the use of register 24 within control circuitry 20. By using switching circuit 43 the bank or block of memory coupled to switching circuit 43 is selected to be non-stand-by memory. More specifically, if the VDD signal to a memory block is lost or fails, switching circuit 43 cannot automatically switch the memory block over to the standby voltage VSTBY to retain data in the memory block. Therefore, the memory bank coupled to switching circuit 43 is non-standby memory, wherein a loss of VDD results in loss of data within the memory bank. However, switching circuit 43 can be controlled by test control circuitry 22, which is located within control circuitry 20 of FIG. 1. When the test signal output from test control circuitry 22 is enabled, switching circuit 43 will decouple the memory banks from VDD and couple the memory banks to the VSTBY signal for testing, such as soft error testing, in which case the test signal would be called a soft error test signal. When power is lost, memory contents are lost using switching circuit 43, but at the same time less power is consumed by integrated circuit 10 due to the lack of memory data retention. Therefore, non-critical program and data information may be placed in memory selected as non-stand-by memory.

In another form, any one or all of power control switches 38–40 can be selected to be implemented via switching circuit 45 of FIG. 3. When using switching circuit 45, register 24 is not utilized to exert control over switching circuit 45. Instead, the voltage VSTBY is automatically selected by switching circuit 45 once the VDD power signal falls below a certain threshold voltage. For example, if VDD is nominal at three volts and VDD manages to drop below a threshold of roughly two volts, switching circuit 45 is switched from VDD to VSTBY. In addition, the test control circuitry 22 of FIG. 1 can be used to output a test signal whereby switching circuit 45 can be forced to switch voltage supply from VDD to VSTBY for test operations as previously discussed.

In yet another embodiment, any one or all of power control switches 38–42 can be selected to be implemented as switching circuit 47 in FIG. 4. With switching circuit 47, a user can program whether a stand-by or low power voltage is selected or whether a normal functional VDD voltage is selected through use of writing a control value consisting of one or more bits in register 24 illustrated in FIG. 1. In addition, switching circuit 47 automatically selects a VSTBY voltage when a VDD voltage either fails or drops below a certain threshold. Furthermore, the test signal output from the test control portion 22 in FIG. 1 can also be used to force switching circuit 47 to change from the VDD voltage supply to the VSTBY voltage supply.

In another embodiment, all three of the switching circuits of FIGS. 2–4 or some plural sub-set thereof can be provided in power control switches 38–42 of FIG. 1. In this design, a user can select, via hardware reset, software, or the like, which type of switching circuit (any one of FIGS. 2–4) is applied to each bank of memory in FIG. 1. For example, with this system, a user can configure, in one time period, power control switch 38 to be switching circuit 43, power control switch 40 to be switching circuit 45, and power control switch 42 to be switching circuit 47 while in another time period integrated circuit 10 can be configured such that power control switch 38 is switching circuit 45, power control switch 40 is switching circuit 47, and power control switch 42 is switching circuit 45. In other words, by providing an additional N-way switch for each power control switch 38–42 and allowing N of the switching circuits selected from FIGS. 2–4 to be resident in power control switches 38–42, the user can effectively program what type of VSTBY and VDD switching control circuitry 20 can exert over specific banks of memory. In essence, the circuit of FIG. 1 allows for dynamic user controlled VSTBY/VDD memory control. If VSTBY is a voltage lower than VDD, then VSTBY can be a low power voltage and VDD can be a normal mode functional voltage. It is important to note that the embodiments herein allow for more than two voltages to be selected by power control switches 38–42.

For example, VSTBY, VDD, and VLPWR (voltage low power) can be provided as inputs to power control switches 38–42 in FIG. 1 in another embodiment.

By way of example for one possible embodiment, assume that power control switch 38 is formed with switching circuit 43, assume that power control switch 40 is formed with switching circuit 45, and assume that power control switch 42 is formed with switching circuit 47. In this configuration, power control switch 38 which is formed with switching circuit 43 will control a bank of memory cells containing memory blocks 26 and 28. Since memory blocks 26 and 28 are controlled with switching circuit 43, then when VDD fails, switching circuit 43 cannot automatically select VSTBY to power memory blocks 26 and 28. Therefore, memory blocks 26 and 28 have been selected as non-stand-by memory. However, test control circuitry 22 can control the power control switch 38 in order to place memory blocks 26 and 28 into a VSTBY power mode to perform test operations. Finally, register 24 can exert no control over switching circuit 43 and therefore, less user programmable software control of memory blocks 26 and 28 is possible using switching circuit 43.

Power control switch 40, which is designed in accordance with switching circuit 45 in this example, controls memory blocks 32 and 34. Therefore, power control switch 40 will automatically switch memory blocks 32 and 34 to VSTBY when the power supply VDD fails. In addition, test control circuitry 22 can force power control switch 40 to use VSTBY instead of VDD when performing test operations. Finally, register 24 can exert no control over power control switch 40, and therefore, less software programmable features are possible for memory blocks 32 and 34 when power control switch 40 is designed in accordance with switching circuit 45.

Power control switch 42 is designed in accordance with switching circuit 47. Therefore, the test signal output from test control circuitry 22 can be used to force power control switch 42 to supply the VSTBY voltage instead of the VDD voltage to memory block 30. In addition, register bank 24 can exert control over power control switch 42 via one or more programmable bits so that software program control or power-on reset control can be exerted over memory block 30 with respect to which voltage source is connected to memory block 30 during certain time periods. Furthermore, if VDD should fail, the VSTBY will be automatically switched to power memory block 30 in accordance with switching circuit 47.

Therefore, with power control switch 38 being designed in accordance with switching circuit 43, power control switch 40 being designed in accordance with switching circuit 45, and power control switch 42 being designed in accordance with switching circuit 47, memory blocks 26 and 28 are non-standby memory, memory blocks 34 and 32 are designed as standby memory, and memory block 30 is software programmable controlled standby memory. In another embodiment, one or more bits in register 24 can be used to force connections to VSTBY or VDD while operating and/or one or more bits from register 24 can be used to determine if the memory bank coupled to the VDARR is stand-by memory or non-stand-by memory.

A discussion of specific switch circuits is now provided in accordance with the circuits illustrated in FIGS. 2–4.

FIG. 2 illustrates a simple and physically small switching circuit 43 which can be used to implement one or more of power control switches 38–42 in FIG. 1. Switch circuit 43 comprises four inverters 50, 52, 54, and 56 which are powered by the VSTBY voltage illustrated in FIG. 1. In addition, switch circuit 43 comprises an inverter 58 powered by the VDD signal illustrated in FIG. 1. Switch circuit 43 also comprises a multiplexer circuit 60, wherein multiplexer circuit 60 provides as an output either the VSTBY voltage or the VDD voltage. The output of multiplexer circuit 60 is illustrated as a voltage supply signal coupled to the memory array (VDARR) and is also illustrated as VDARR in FIG. 1. Switch circuit 43 also provides a status signal which can be communicated to one of either control circuitry 20 or CPU 12 to indicate to either CPU 12 or control circuitry 20 which voltage, either VDD or VSTBY, is being driven on the output VDARR. In general, switch circuit 43 is a 2-to-1 multiplexer wherein the test signal functions as the select input and the VSTBY and the VDD signals are the two inputs to the 2-to-1 multiplexer. By either enabling or disabling the test signal as the output from the test control circuit 22, one of either VDD or VSTBY is selected for a specific block or bank of memory illustrated in FIG. 1.

FIG. 3 illustrates an alternate switching circuit 45 which can be used as one or more of power control switches 38–42 of FIG. 1. Switch circuit 45 comprises an RC circuit 70, a NAND gate 72, an RC circuit 84, an inverter 74, an inverter 76, an inverter 78, an inverter 80, a multiplexer circuit 82, an inverter 86, an inverter 88, and an inverter 90. RC circuit 70 is used to stabilize fluctuations on a noisy VDD supply voltage signal. The VDD signal and the test signal output from the test control circuitry 22 of FIG. 1 are input to a NAND gate 72. Another RC circuit 84 is coupled to an output of NAND gate 72 in order to further decouple noise from the system. The filtered signal provided by RC circuit 84 is provided to a plurality of inverters 74, 76, and 80 wherein these inverters 74, 76 and 80 are coupled to the VSTBY voltage. Inverter 78 is coupled to the VDD voltage so that the natural tendency of inverter 78 is to pull low when VDD fails. The plurality of inverters 74–80 feed multiplexer circuit 82. The circuitry 70 through 80 and the RC circuit 84 provide the select signal to multiplexer circuit 82. The two inputs to multiplexer circuit 82 are the VDD signal and the VSTBY signal as illustrated in FIG. 3 and FIG. 1.

In response to the proper select signal, one of either VDD or VSTBY is provided as the VDD array (VDARR) output of multiplexer circuit 82 as illustrated in FIG. 1. In addition, switch circuit 45 provides two status signals. A first status signal (ARRAY STATUS SIGNAL) is provided to memory array 11 so that memory array 11 is able to determine which power supply is being supplied to which memory banks. A second status signal (CONTROL STATUS SIGNAL) is provided to control circuitry 20 so that control circuitry 20 is informed of memory power configurations within integrated circuit 10. The first status signal provided by multiplexer circuit 60 is also provided to a plurality of inverters 74, 76, and 80, wherein these inverters 74, 76 and 80 are coupled to the VSTBY voltage, and their output is the second status signal. Switch circuit 45 is designed so that when VDD fails, VSTBY is automatically coupled to the VDARR output. In addition, switch circuit 45 is designed to respond to the test signal provided by test control circuitry 22 of FIG. 1. In other words, when test signal is enabled, VSTBY is provided to the output of VDARR and when test signal is disabled, the VDD signal is provided to the output VDARR.

FIG. 4 illustrates a switching circuit 47 that is similar to that illustrated in FIG. 3. All of the functionality illustrated and discussed with respect to switch circuit 45 is likewise possible with switch circuit 47. However, switch circuit 47 provides for additional functionality over that provided with switch circuit 45. Unlike switch circuit 45, switch circuit 47 can be controlled by register 24 of FIG. 1. By writing one or more binary values to register 24, one or more switches designed in accordance with switch circuit 47 can be programmed to intelligently provide either VDD or VSTBY on the output VDARR. To enable this intelligent software user programmable response, an OR gate 92 is added to switch circuit 45 to form switch circuit 47, and in addition a D flip-flop located within register 24 is also utilized, as shown in FIG. 4. In this embodiment, register 24 provides a control signal to switch circuit 47 in response to a software instruction being executed in CPU 12. More specifically, the D flip-flop located within register 24, when selected by address bus 16 receives as an input at least one bit from data bus 14 in FIG. 1, and in response to this input the D flip flop sends a control signal to OR gate 92. In other words, software provided by a computer programmer or a user of the integrated circuit 10 can be used to program binary values within register 24 in order to control which voltage power pin is coupled to which memory banks or blocks within IC 10.

In one form, VSTBY can be a voltage equivalent in value to VDD. In this form, no substantial power saving is realized in switching between VDD and VSTBY, and VSTBY is simply used as a back-up voltage which retains the content of memory when VDD fails. Control circuitry 20 may or may not lock the memory blocks when in a VSTBY mode so that contents of various memory blocks are protected when the VSTBY mode is entered. In another form, VSTBY can be a voltage less than a VDD voltage. In this form, when the VSTBY voltage is operative in a memory bank, the memory bank which may comprise SRAM cells will retain the logic values within storage, but will consume less power. Therefore, the switching illustrated in FIG. 1 can be used to perform power management within memory array 11.

Figure 5:
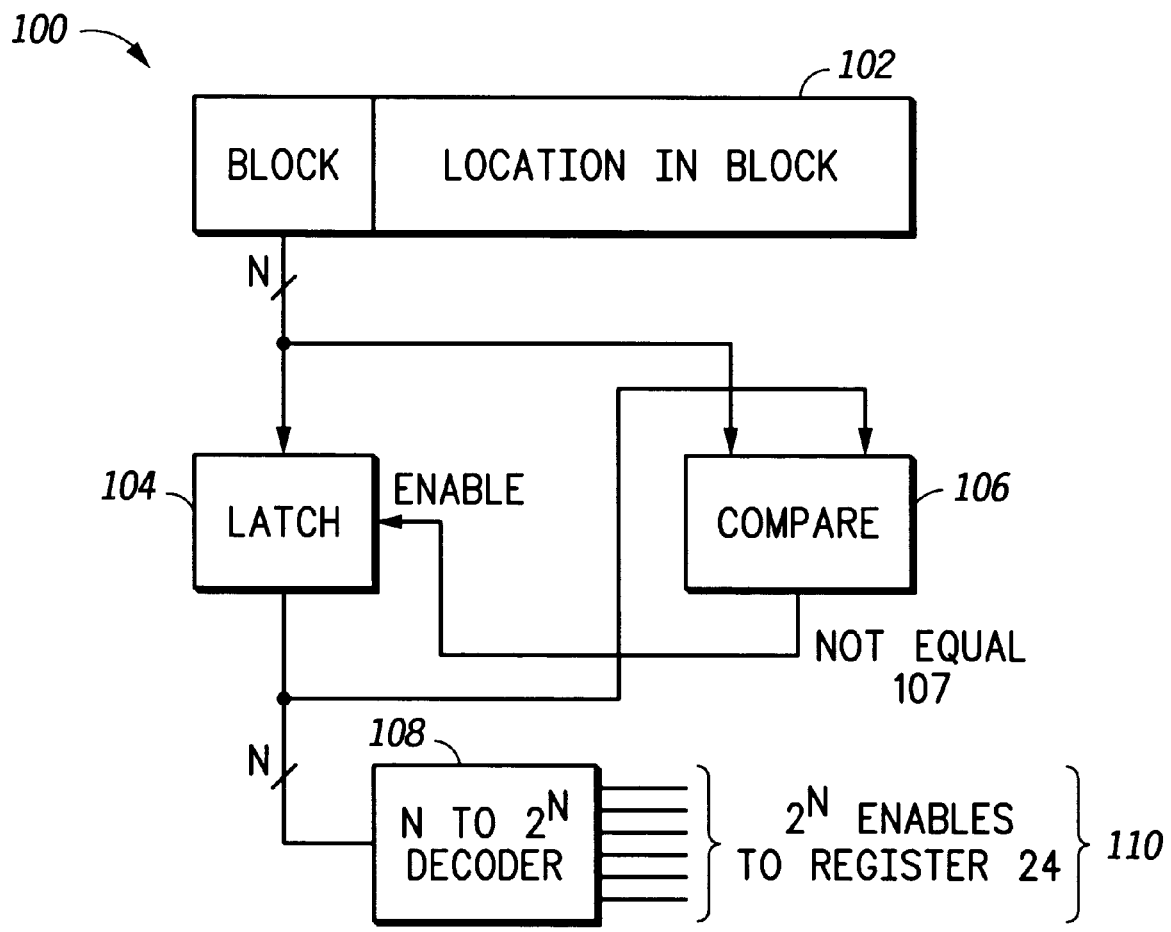
FIG. 5 illustrates, in a block diagram form, a controller which can be used to intelligently and dynamically control low power and normal power supply voltages provided to banks and/or blocks of RAM as a function of memory access or software execution flow in accordance with the present invention.

FIG. 5 illustrates a controller 100 which can be used to selectively and independently couple memory blocks 26 through 34 to either VDD or standby (VSTBY) voltage supply pins. Controller 100 of FIG. 5 will reside in control circuitry 20 of FIG. 1. Controller 100 will monitor addresses issued by CPU 12. These issued addresses, illustrated as address 102 in FIG. 5, may either be operand reads/writes and/or opcode fetches. The operational concept behind controller 100 is that the addresses issued by CPU 12 can be observed by controller 100 whereby only the block or bank of memory which is currently being accessed by CPU 12 can be powered into a high powered VDD mode whereby all other memory cells in FIG. 1 are put into a VSTBY or low power mode. In other words, the memory banks or memory blocks are selectively enabled or disabled to VDD as a function of program execution flow as the program execution flow dynamically changes within CPU 12. By intelligently monitoring the program execution flow through memory blocks 26 through 34, only selective portions of memory which are actively being used can be enabled whereby all other memory portions can be placed into a low power mode to conserve over-all power within integrated circuit 10 of FIG. 1.

FIG. 5 illustrates an address 102. N bits of address 102 are used to indicate/decode which block or bank of memory array 11 is being accessed for each particular memory read or write operation. When the N bits of address 102 are issued by CPU 12, they are latched by a latch 104 or a like storage device. Once the N bits of address 102 have been latched in latch 104, latch 104 is not clocked again to store a new value until the compare circuitry 106 determines that a new/different N bits of address 102 has been issued by CPU 12 wherein these new/different N bits are not equal to the N bits already stored in latch 104. Therefore, compare circuitry 106 compares a current binary output of latch 104 with a new set of N bits of address 102 provided from CPU 12 and latches the new N bits of address 102 only when the new N bits of address 102 differ from the N bits of address 102 currently stored in latch 104. The binary value stored in latch 104 is output to a decoder 108. If N is 4 in FIG. 5 (i.e., four address bits are used to decode bank/block), the output of the decoder 108 will consist of 16 binary signals. Of the 16 outputs or $2^N$ outputs of decoder 108, only one of the outputs will be enabled at any one point in time. These 16 or $2^N$ binary signals are then written to register 24 of FIG. 1 wherein the outputs 110 of FIG. 5 are used to turn on (i.e., power to VDD) only one block or bank of memory in memory array 11 in FIG. 1.

While controller 100 consumes little surface area within integrated circuit 10 of FIG. 1, controller 100 may not be an optimal solution for all embodiments. For example, if CPU 12 is executing a set of 10 instructions in a looping manner where 5 of the 10 instructions reside in memory block 30 and another 5 of the instructions reside in memory block 32, then latch 104 of FIG. 5 will be switching state every 5 memory reads, every time through the loop. In other words, controller 100 will "thrash" back and forth enabling memory block 30 and disabling memory block 32 and then enabling memory block 32 while disabling memory block 30 in every loop. This thrashing between memory blocks or banks may be disadvantageous in some designs. This thrashing would be especially disadvantageous when the circuitry within integrated circuit 10 is such that VSTBY and VDD are of substantially different voltages requiring that a memory block be charged over time to VDD before being brought out of a disabled state into an enable state. In other circumstances, for example, CPU 12 may be executing code from memory block 34 of FIG. 1 while accessing data in memory block 26 of FIG. 1. In this case, controller 100 will also thrash between memory block 34 and memory block 26. To avoid this thrashing in certain embodiments, the controllers of FIGS. 6–7 are provided.

Figure 6:
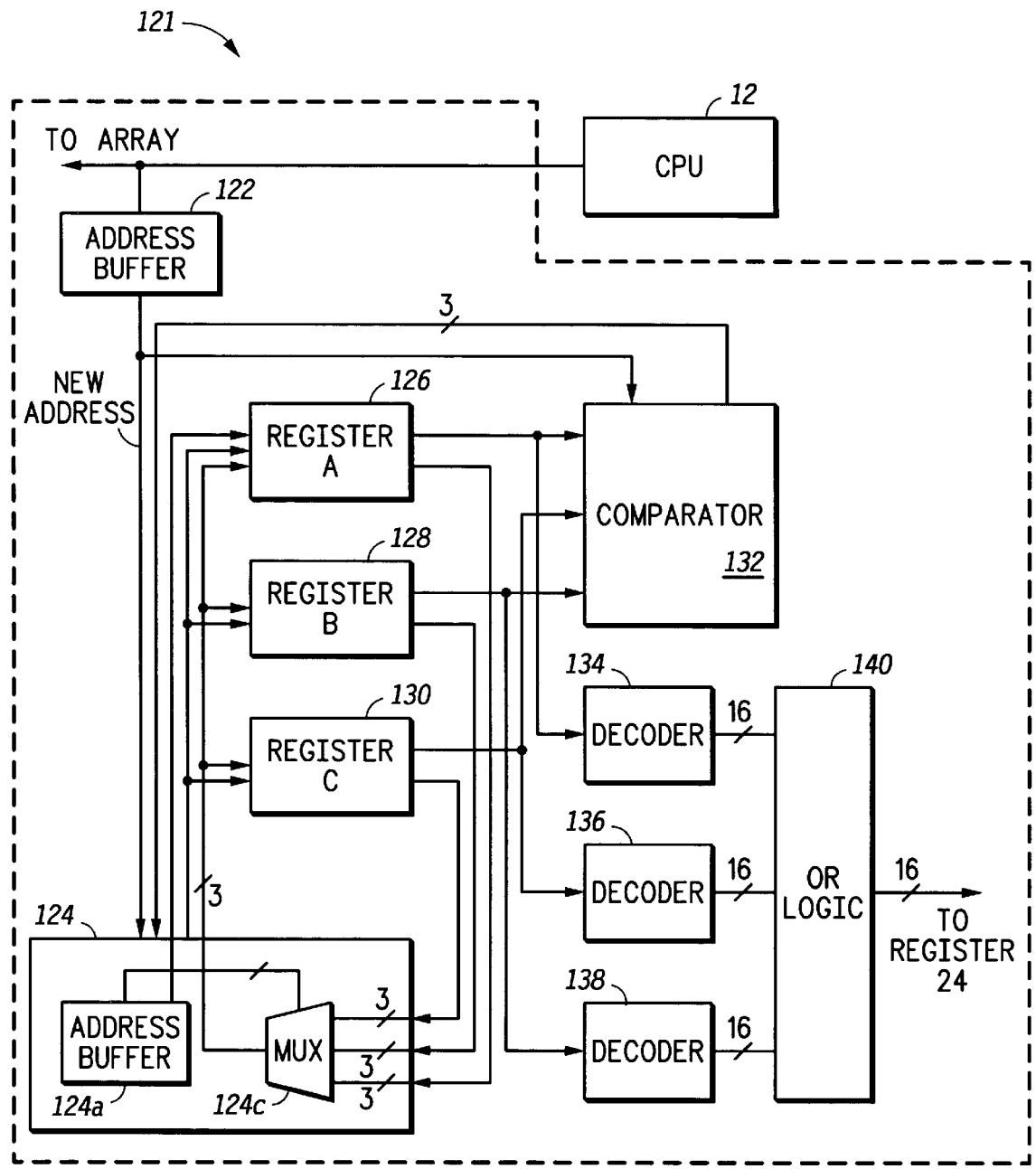
FIG. 6 illustrates, in a block diagram form, another controller which can be used to intelligently and dynamically control low power and normal power supply voltages provided to banks and/or blocks of RAM as a function of memory access or software execution flow in accordance with the present invention.
Figure 7:
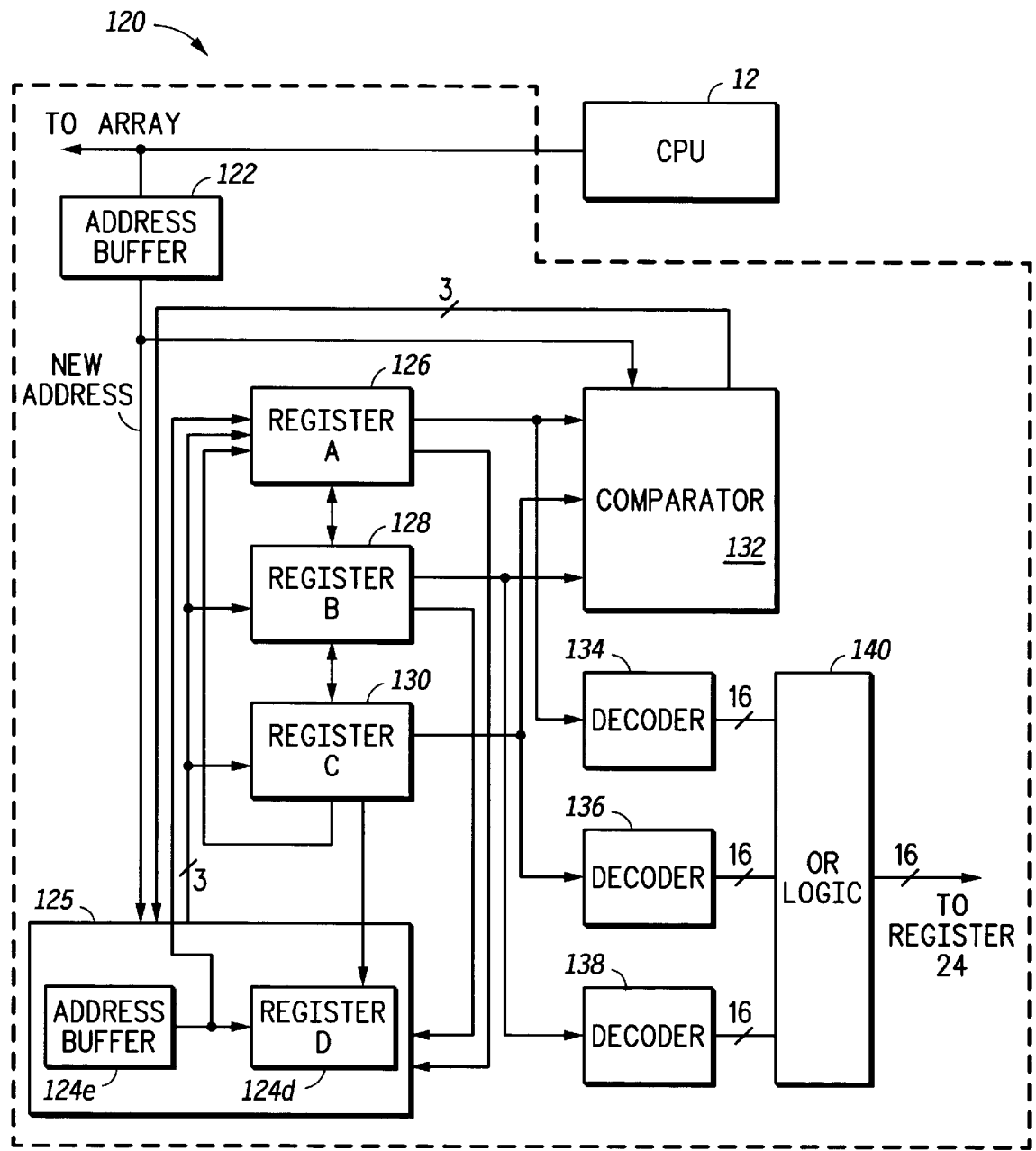
FIG. 7 illustrates, in a block diagram form, another controller which can be used to intelligently and dynamically control low power and normal power supply voltages provided to banks and/or blocks of RAM as a function of memory access or software execution flow in accordance with the present invention.

FIG. 6 illustrates controller 121 which may reside within control circuitry 20 in FIG. 1. Controller 121 is similar to controller 100 of FIG. 5 in that the goal of controller 121 is to provide control signals which only enable banks of RAM which are currently being used or have been used recently in the past to improve upon power consumption. In other words, controller 121 is a special purpose cache which caches the most recent accesses to memory blocks 26–34 and only enables the cached or last few blocks/banks of memory which have accessed to reduce over-all consumed power. A least recently used (LRU) replacement algorithm is implemented in controller 121 of FIG. 6.

FIG. 6 specifically illustrates that only three banks or blocks of memory are stored in the cache via registers 126–130, wherein in an optimal design, no two values in the three registers 126–130 are equal. It should be noted, however, that more than three or less than three banks or blocks of cells can be stored in cache, thereby controlling an amount of memory enabled in the system of FIG. 1. In FIG. 6, CPU 12 provides a stream of addresses. The addresses provided by CPU 12 are latched in an address buffer 122 or provided directly to control circuitry 124 which includes address buffer 124a and multiplexer circuitry 124c. Control circuitry 124 of FIG. 6 comprises a state machine and multiplex switching circuitry having an operation outlined in FIG. 8.

Figure 8:
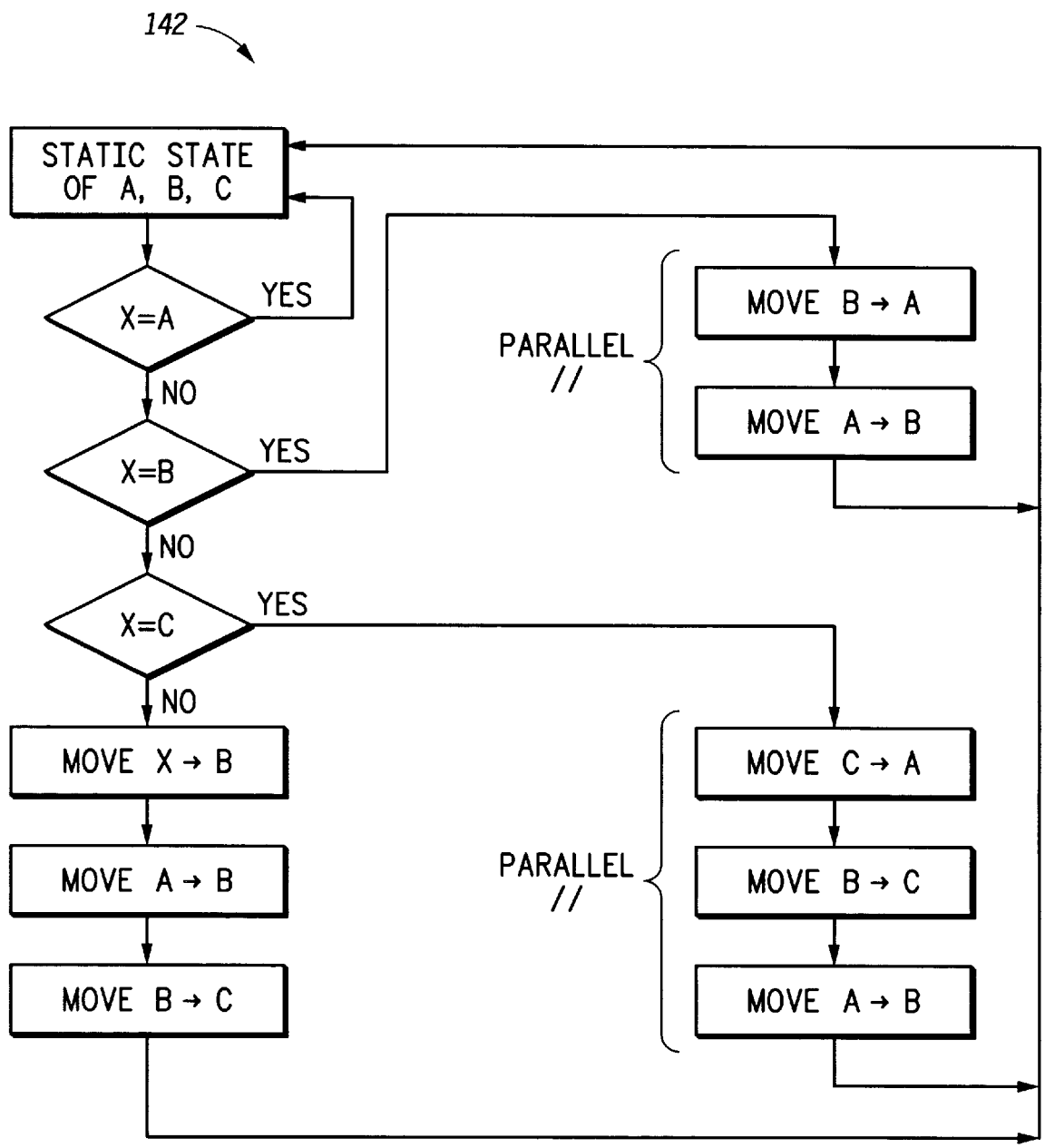
FIG. 8 illustrates, a flow diagram for control circuitry in accordance with one embodiment of the invention.

When CPU 12 initially begins to process address and data information, registers 126–130 will be empty. Control circuitry 124 will realize that registers 126–130 are empty and will therefore cache the first three sets of N bits of FIG. 6 into registers 126–130 as the first three sets of distinct N bits occur through address buffer 122. After registers 126–130 have been filled with valid address bits, the state machine of FIG. 8 will be implemented by control circuitry 124 resulting in an LRU replacement method on the contents of registers 126–130. In order to describe control circuitry 124 of FIG. 6, a discussion of FIG. 8 is helpful.

In FIG. 6, assume that 5 banks of memory are individually capable of being enabled at any one point in time. Assume that these 5 banks of memory are referred to as bank 1 through bank 5. Further assume that the first three banks of memory accessed by CPU 12 are banks 1–3. Address bits associated with bank 1 will be stored in register 126, address bits of bank 2 will be stored in register 128, and address bits associated with bank 3 will be stored in register 130. After this initialization of controller 121, assume CPU 12 once again accesses bank 1. Since a least recently used (LRU) algorithm is employed in the state machine of FIG. 8, bank 1 must be moved to the top of registers 126–130 while maintaining the other most recently used banks 2 and 3. Since the order in registers 126–130 is already such that bank 1 is on top of the LRU structure formed by registers 126–130, bank 2 is in register 128 and bank 3 is in register 130, no changes need to be made to registers 126–130 due to CPU 12 accessing bank one again (i.e., registers 126–130 already contain by default the proper order of memory banks). Therefore, as illustrated in FIG. 8, when a new incoming address X equals the value stored in register A (register 126), no changes are made within registers 126–130.

Assume, however, that the new incoming address X from CPU 12 is equal to the bank 2 values stored in register 128. Since X is equal to the value of B stored in register 128, the state diagram of FIG. 8 indicates that the value in register 128 is moved to register 126 while the value in register in 126 is moved down in priority to register 128 whereby the contents of register 130 are maintained as the lowest priority item in the LRU structure. In essence, when the incoming address X equals the value in register 128, the value in 128 is the most recently used location and must be moved to the front of the queue whereby the other two remaining elements are placed near the end of the queue.

Assume the original configuration wherein register 126 stores bank 1 as most recently used, register 128 stores bank 2, and register 130 stores bank 3 as the least recently used bank. Then assume that bank 3 is accessed from CPU 12 wherein bank 3 is already stored in register 130. The flowchart of FIG. 8 indicates that when a new address X is equal to the value C stored in register 130, that the contents of register 130 is moved to register 126 (back up into the most recently used location), the contents of register 128 are moved to register 130, and the contents of register 126 are moved to the register 128. This switching of contents of registers are performed by the multiplexer circuitry 124c located within control circuitry 124.

Assume that banks 1 through 3 are stored respectively in registers 126–130. Assume now that the CPU 12 accesses bank 4. Since bank three is stored in the lowest-priority location of the queue, FIG. 8 indicates that the new address X which refers to bank 4 is moved into register 126 as the new most recently used item. Bank 1 which was in register 126 is moved to register 128 and has a second priority in the queue/cache. The least recently used element is now bank 2 which is moved from register 128 to register 130 in FIG. 6. The bank 3 which was previously stored in register 130 is now removed from the entire queue and is no longer resident within the system of FIG. 6 and therefore no longer enabled by connection to VDD. Therefore, when bank 4 has been accessed, register 126 will contain bank four, register 128 will contain address bits of bank one, and register 130 will contain address bits of bank two wherein controller 121 of FIG. 6 will enable only these most recently used banks 1, 2, and 4, while banks 3 and 5 will be in a low power mode of operation.

As should now be understood, the registers 126–130 along with the state machine implemented via control circuitry 124 and FIG. 8 allows for the three most recently used banks of memory to be identified/stored by registers 126–130. In order to perform the moves between registers 126, 128, and 130 as previously described with respect to FIG. 8, the comparator logic 132 of FIG. 6 is utilized to determine the flow used from FIG. 8. The decoders 134–138 and the OR logic 140 are used to send out control signals to register 24 of FIG. 1. Decoders 134–138 will each issue a one hot control signal indicating the three banks of most recently used memory which should be enabled. The OR logic 140 will logically-OR together the three enabled signals from decoders 134–138 to result in three enable values which are then stored in register 24. Register 24 will then use these three enabled values to enable the three most recently used banks of memory within FIG. 1. All other banks of memory which are not stored within controller 121 are disabled or placed into a low powered stand by mode. This LRU/cache replacement technique and multiple entry cache avoids the thrashing previously discussed, but requires more silicon surface area in order to be implemented.

FIG. 7 illustrates an alternate controller 120. A primary difference between controller 121 and 120 is that the control circuitry 125 of controller operates in a manner slightly different from control circuitry 124. Instead of using shadow registers and/or multiplexer circuitry, one or more temporary storage registers 124d can be used along with address buffer 124e to perform the proper switching of contents between registers 126–130 in either a serial or parallel manner. In essence, the controllers of FIGS. 6 and 7 are similar and provide the same functionality as previously discussed with slight changes in the state machine operation.

FIG. 8 illustrates the functional operation of the control circuitry 124 and control circuitry 125 of FIGS. 6 and 7, respectively. FIG. 8 was previously discussed in detail with respect to FIG. 6 and a description is not repeated here for the sake of brevity.

Thus it is apparent that there has been provided, in accordance with the present invention, a circuit and layout which significantly reduces or eliminates unwanted crossbar current in a semiconductor device. Although the invention has been described and illustrated with reference to the specific embodiment, it is not intended that the invention be limited to these illustrative embodiments. Those skilled in the art will recognize that modifications and variations may be made with departing from the spirit and scope of the invention. Therefore, it is intended that this invention encompass all variations and modifications as fall within the scope of the appended claims.

What is claimed is:

1. An integrated circuit comprising:

a first plurality of volatile memory cells;

a first power line;

a second power line;

a first power control switch electrically coupled to the first plurality of volatile memory cells, electrically coupled to the first power line, and electrically coupled to the second power line, wherein in response to a first control signal the first plurality of volatile memory cells is either electrically coupled to the first power line or is electrically coupled to the second power line;

a register electrically coupled to the first power control switch, wherein the register provides the first control signal to the first power control switch;

a second plurality of volatile memory cells; and a second power control switch electrically coupled to the second plurality of volatile memory cells, electrically coupled to the first power line, and electrically coupled to the second power line, wherein in response to a second control signal the second plurality of volatile memory cells is either electrically coupled to the first power line or is electrically coupled to the second power line.

2. The integrated circuit of claim 1, wherein the first power line is further characterized as a VDD line and the second power line is further characterized as a standby voltage line.

3. The integrated circuit of claim 2, wherein in response to the first control signal and a power failure the first power control switch electrically couples the first plurality of volatile memory cells to the standby voltage line.

4. The integrated circuit of claim 2, wherein in response to the second control signal the second power control switch electrically decouples the second plurality of volatile memory cells from the VDD line and electrically couples the second plurality of volatile memory cells to the standby voltage line.

5. The integrated circuit of claim 4, wherein the second control signal is further characterized as a test signal.

6. The integrated circuit of claim 5, wherein the test signal is further characterized as a soft error test signal.

7. The integrated circuit of claim 1, wherein the second control signal is generated in response to a power failure.

8. The integrated circuit of claim 7, wherein data retention within the second plurality of volatile memory cells is not maintained in response to the power failure.

9. The integrated circuit of claim 7, wherein data retention within the first plurality of volatile memory cells is maintained in response to the power failure.

10. The integrated circuit of claim 7, wherein data retention within the second plurality of volatile memory cells is maintained in response to the power failure.

11. The integrated circuit of claim 7, wherein data retention within the first plurality of volatile memory cells is not maintained in response to the power failure.

12. The integrated circuit of claim 7, wherein data retention within the first plurality of volatile memory cells, and data retention within the second plurality of volatile memory cells is maintained in response to the power failure.

13. The integrated circuit of claim 1, wherein the first plurality of volatile memory cells is further characterized as a first plurality of SRAM cells.

14. The integrated circuit of claim 1, wherein the first plurality of volatile memory cells is further characterized as a first plurality of six transistor SRAM cells.

15. The integrated circuit of claim 1, wherein the first plurality of volatile memory cells is further characterized as a first memory block.

16. The integrated circuit of claim 14, wherein the second plurality of volatile memory cells is further characterized as a second memory block.

17. The integrated circuit of claim 1, wherein the first plurality of volatile memory cells is further characterized as a first memory bank comprising a plurality of memory blocks.

18. The integrated circuit of claim 17, wherein the second plurality of volatile memory cells is further characterized as a second memory bank of comprising a plurality of memory blocks.

19. The integrated circuit of claim 1, wherein the register is electrically coupled to the second power control switch and provides the second control signal to the second power control switch.

20. The integrated circuit of claim 1, further comprising a central processing unit electrically coupled to the register, wherein the register provides the first control signal to the first power control switch in response to a software instruction executed in the central processing unit.

21. The integrated circuit of claim 1, wherein the first power line is further characterized as having a first voltage and the second power line is further characterized as having a second voltage, wherein the first voltage is greater than the second voltage.

22. The integrated circuit of claim 1, wherein data retention within the first plurality of volatile memory cells is either maintained or not maintained in response to a power failure and the first control signal.

23. The integrated circuit of claim 22, wherein data retention within the first plurality of volatile memory cells is either maintained or not maintained in response to a power failure and the second control signal.

24. An integrated circuit comprising:
a volatile memory, the volatile memory comprising a first plurality of volatile memory cells, a second plurality of volatile memory cells, and a third plurality of volatile memory cells;
a first power line;
a second power line;
a fist power control switch electrically coupled to the first plurality of volatile memory cells, electrically coupled to the first power line, and electrically coupled to the second power line, wherein in response to a first control signal the first plurality of volatile memory cells is either electrically coupled to the first power line or is electrically coupled to the second power line; and
a register electrically coupled to the first power control switch, wherein the register provides the first control signal to the first power control switch;
a second power control switch electrically coupled to the second plurality of volatile memory cells, electrically coupled to the first power line, and electrically coupled to the second power line, wherein in response to a second control signal the second plurality of volatile memory cells is either electrically coupled to the first power line or is electrically coupled to the second power line; and
a third power control switch electrically coupled to the third plurality of volatile memory cells, electrically coupled to the first power line, and electrically coupled to the second power line, wherein in response to a third control signal the third plurality of volatile memory cells is either electrically coupled to the first power line or is electrically coupled to the second power line.

25. The integrated circuit of claim 24, wherein the first power line is further characterized as having a first voltage and the second power line is further characterized as having a second voltage, wherein the first voltage is greater than the second voltage.

26. The integrated circuit of claim 24, wherein data retention within the first plurality of volatile memory cells is maintained in response to a power failure and the first control signal.

27. The integrated circuit of claim 24, wherein data retention within the first plurality of volatile memory cells is not maintained in response to a power failure and the first control signal.

28. The integrated circuit of claim 24, wherein the first control signal electrically couples the first plurality of volatile memory cells to either the first power line or the second power line in response to a power failure.

29. The integrated circuit of claim 24, further comprising a central processing unit electrically coupled to the register, wherein the register provides the first control signal to the first power control switch in response to a software instruction executed in the central processing unit.

30. The integrated circuit of claim 24, wherein the first plurality of volatile memory cells is further characterized as a plurality of SRAM cells.

31. The integrated circuit of claim 24, wherein the first plurality of volatile memory cells is further characterized as a plurality of six transistor SRAM cells.

32. The integrated circuit of claim 24, wherein the first plurality of volatile memory cells is further characterized as a first memory block.

33. The integrated circuit of claim 24, wherein the first plurality of volatile memory cells is further characterized as a memory bank comprising a plurality of memory blocks.

34. The integrated circuit of claim 24, further comprising test control circuitry electrically coupled to the first power control switch, wherein the test control circuitry provides a test signal to the &a power control switch.

35. The integrated circuit of claim 34, wherein in response to the test signal the first power control switch electrically couples the first plurality of volatile memory cells to a standby voltage line.

36. The integrated circuit of claim 3, wherein the test signal is further characterized as a soft error test signal.

37. The integrated circuit of claim 24, wherein the first power line is further characterized as a VDD line and the second power line is further characterized as a standby voltage line.

38. The integrated circuit of claim 37, wherein in response to the first control signal and a power failure the first power control switch electrically couples the first plurality of volatile memory cells to the VDD line.

39. The integrated circuit of claim 37, wherein in response to the first control signal and a power failure the first power control switch electrically couples the first plurality of volatile memory cells to the standby voltage line.

40. The integrated circuit of claim 37, wherein in response to a power failure the first power control switch electrically couples the plurality of find volatile memory cells to a standby voltage line.

41. The integrated circuit of claim 40, wherein data retention within the first plurality of volatile memory cells is maintained in response to the power failure.

42. A method for providing a supply voltage to a plurality of memory blocks within an integrated circuit, the method comprising the steps of:
providing the integrated circuit, the integrated circuit having a first memory block, the first memory block comprising a first plurality of volatile memory cells, a second memory block, the second memory block comprising a second plurality of volatile memory cells, a register, a first power control switch, and a second power control switch, wherein the first power control switch is coupled to the first memory block and the second power control switch is coupled to the second memory block and the register is coupled to at least the first power control switch;
providing a first supply voltage and a second supply voltage to the first power control switch and to the second power control switch;
providing a first control signal to the first power control switch in response to writing a control value to the register, wherein response to the first control signal the first memory block is either coupled to the first supply voltage or the second supply voltage; and
providing a second control signal to the second power control switch, wherein response to the second control signal the second memory block is either coupled to the first supply voltage or the second supply voltage.

43. The method of claim 42, wherein the step of providing the first supply voltage and the second supply voltage, the first supply voltage is further characterized as a VDD supply voltage and the second supply voltage is further characterized as a standby supply voltage.

44. The method of claim 43, wherein the step of providing the first control signal the first control signal couples the first memory block to the standby supply voltage when the VDD supply voltage drops below a threshold voltage.

45. The method of claim 43, wherein the step of providing a second control signal the second control signal couples the second memory block to the standby supply voltage when the VDD supply voltage drops below a threshold voltage.

46. The method of claim 43, wherein the step of providing the first control signal the first control signal couples the first memory block to the standby supply voltage in response to a power failure.

47. The method of claim 43, wherein the step of providing the first control signal the first control signal couples the first memory block to the VDD supply voltage in response to a power failure.

48. The method of claim 42, wherein the step of providing the first supply voltage and the second supply voltage, the first supply voltage is unequal to the second supply voltage.

49. The method of claim 42, wherein the step of providing the integrated circuit, the first plurality of volatile memory cells are further characterized as a first plurality of six transistor SRAM cells.

50. The method of claim 42, wherein the step of providing the integrated circuit, the first plurality of volatile memory cells are further characterized as a first plurality of SRAM cells.

* * * * *

UNITED STATES PATENT AND TRADEMARK OFFICE
CERTIFICATE OF CORRECTION

PATENT NO. : 5,901,103
DATED : May 4, 1999
INVENTOR(S) : Joseph M. Harris II, et al.

It is certified that error appears in the above-identified patent and that said Letters Patent is hereby corrected as shown below:

Claim 24, column 13, line 10, replace "fist" with --first--.

Claim 40, column 14, line 24, replace "find" with --first--.

Signed and Sealed this

Seventh Day of December, 1999

Attest:

Q. TODD DICKINSON

*Attesting Officer*     *Acting Commissioner of Patents and Trademarks*